: US005480047A

United States Patent [19]
Tanigawa et al.

[11] Patent Number: 5,480,047
[45] Date of Patent: Jan. 2, 1996

[54] METHOD FOR FORMING A FINE RESIST PATTERN

[75] Inventors: Makoto Tanigawa, Kitakatsuragi; Hiroki Tabuchi, Nara; Takayuki Taniguchi, Tenri, all of Japan

[73] Assignee: Sharp Kabushiki Kaisha, Japan

[21] Appl. No.: 242,082

[22] Filed: May 12, 1994

[30] Foreign Application Priority Data

Jun. 4, 1993 [JP] Japan .................................. 5-134348

[51] Int. Cl.⁶ .................................................. B44C 1/22
[52] U.S. Cl. ............................... 216/12; 216/24; 216/41
[58] Field of Search .............................. 156/655, 659.1, 156/668, 904; 430/5, 296, 313, 321, 323; 216/12, 41, 24

[56] References Cited

U.S. PATENT DOCUMENTS

5,024,726 6/1991 Fujiwara ............................ 156/655 X
5,221,429 6/1993 Makuta ............................... 156/657 X
5,278,028 1/1994 Hadimioglu et al. ............... 156/657 X
5,330,862 7/1994 Tabuchi et al. ......................... 430/5

Primary Examiner—William Powell
Attorney, Agent, or Firm—Nixon & Vanderhye

[57] ABSTRACT

A method for forming a fine resist pattern by exposing comprising the steps of: (i) forming a resist layer on a semiconductor substrate; (ii) forming a phase shifting pattern in an upper portion of the resist layer, the phase-sifting pattern having a tapered edge corresponding to a portion to which formation of an objective fine resist pattern is not desired; (iii) exposing the entire surface of the semiconductor substrate including the phase-shifting pattern; and (iv) forming a fine resist pattern below an outline except for the tapered edge of the phase-shifting pattern.

4 Claims, 7 Drawing Sheets

METHOD FOR FORMING A FINE RESIST PATTERN

BACKGROUND OF THE INVENTION

1. Field of the Invention

The present invention relates to a method for forming a fine resist pattern, and more particularly to a method for forming a fine resist pattern utilizing a phase-shifting effect in the fabrication of a semiconductor device.

2. Description of the Invention

An attention is given to a method for forming a fine pattern exceeding the resolution limit of a reduction projection aligner, namely stepper which utilizes a phase-shifting effect usually on a mask.

There is also proposed a method for forming a fine pattern utilizing a phase-shifting effect on a semiconductor substrate (IEDM 91, pase 63–66 and U.S. Ser. No. 874,809, filed Apr. 28, 1992, now U.S. Pat. No. 5,330,862). This method involves forming a resist layer on a semiconductor substrate; forming a phase-shifting pattern in an upper portion of the resist layer; exposing the surface of the semiconductor substrate including the phase-shifting pattern; and forming a fine resist pattern below the edge of the phase-shifting pattern.

Hereinbelow is described a method for forming a fine resist pattern by providing a phase-shifting pattern on a single layered resist surface using a phase-shifting effect on a semiconductor substrate.

Figure 15:
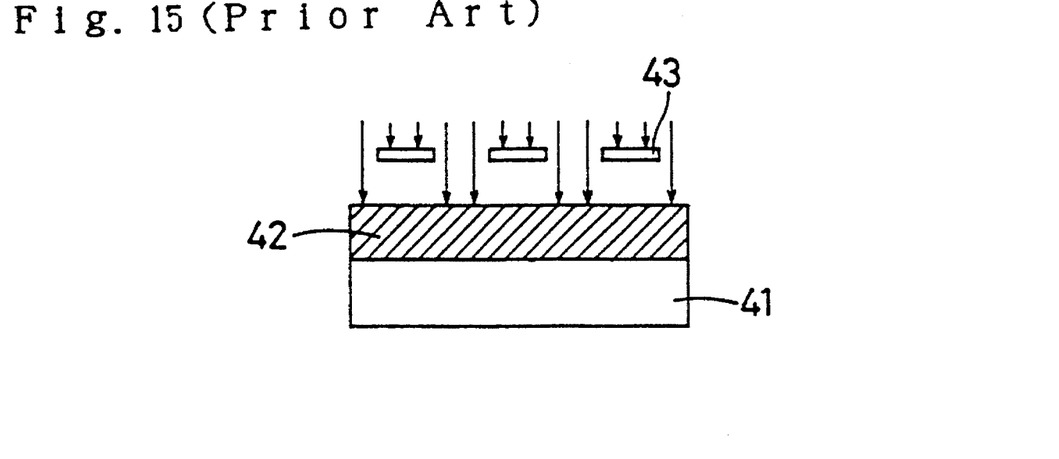
FIG. 15 is a schematic sectional view of an essential portion thereof showing the first step of the conventional method for forming a resist pattern.

As shown in FIG. 15, a positive type resist is applied on a silicon substrate 41 with the spin-on method, and then prebaked to form a resist layer 42, followed by subjecting the surface of the resist layer 42 to exposure using a mask 43.

Figure 16:
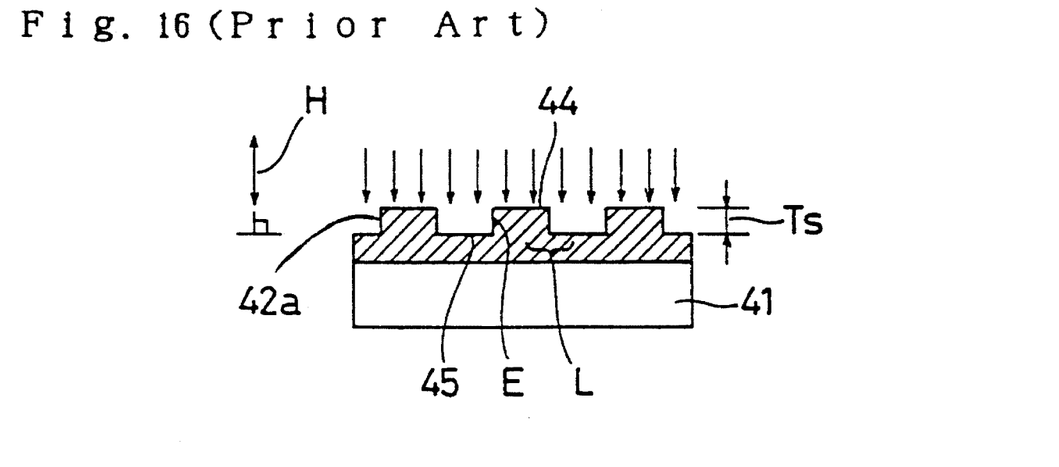
FIG. 16 is a schematic sectional view of an essential portion thereof showing the second step of the conventional method for forming a resist pattern.
Figure 17:
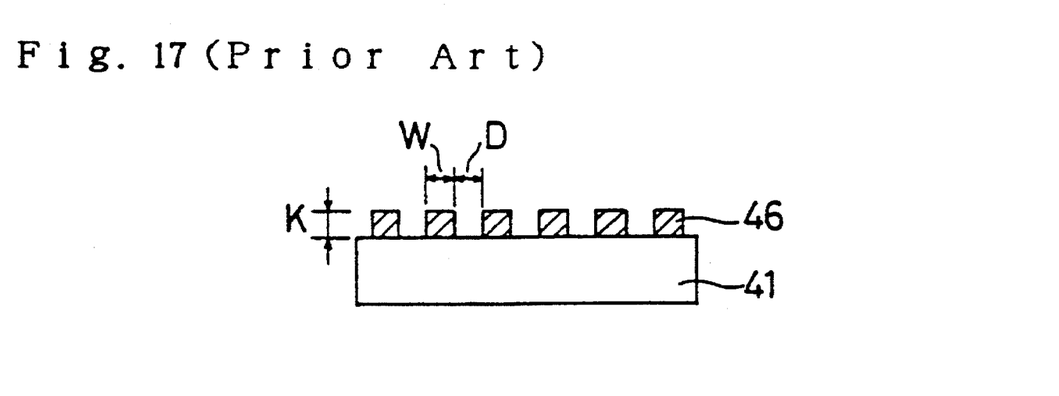
FIG. 17 is a schematic sectional view of an essential portion thereof showing the third step of the conventional method for forming a resist pattern.

The resist layer 42 is taken baked and developed to form a phase-sifting pattern 42a as a projecting portion 44, as shown in FIG. 16. The thickness Ts of the phase-shifting pattern 42a is identical to the height thereof in the direction perpendicular to the surface of the projecting portion 44 (in the direction of an arrow designated by Symbol H in FIG. 16). Subsequently, the entire surface of the resist layer 42 including the phase-sifting pattern 42a is exposed, where the phase of light passing through the phase-shifting pattern 42a is almost reversed to the phase of light passing through a recessed portion 45 sandwiched between the projecting portion 44. This means that the optical amplitudes of the two lights are offset each other in a lower region L at the edge E of the phase-shifting pattern 42a, whereby the light intensity becomes zero. Consequently, the lower region L at the edge E of the phase-shifting pattern 42a is not exposed, so that the fine resist pattern 46 is formed after the development as shown in FIG. 17.

Figure 18:
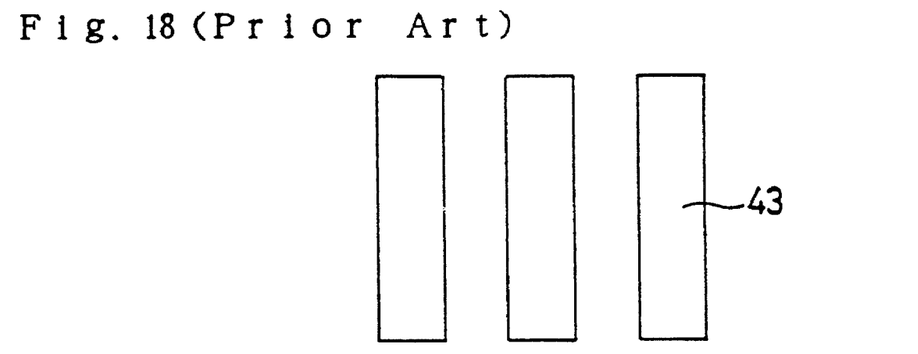
FIG. 18 is a plan view of a mask used in the conventional method.

In the above method, a mask 43 shown in FIG. 18 is used to expose the resist layer 42, thereby forming a phase-shifting pattern 42a. Thereafter, exposing over the entire surface of the resist layer 42 including the phase-shifting pattern 42a results in the mutual offset of the phase of light passing through the phase-shifting pattern 42a as a projecting portion 44 in FIG. 19 with the phase of light passing through the recessed portion 45. Thus, the lower region L at the edge E of the phase-shifting pattern 42a is not exposed, thereby forming a fine resist pattern 46 shown in FIG. 20 after development.

Figure 19:
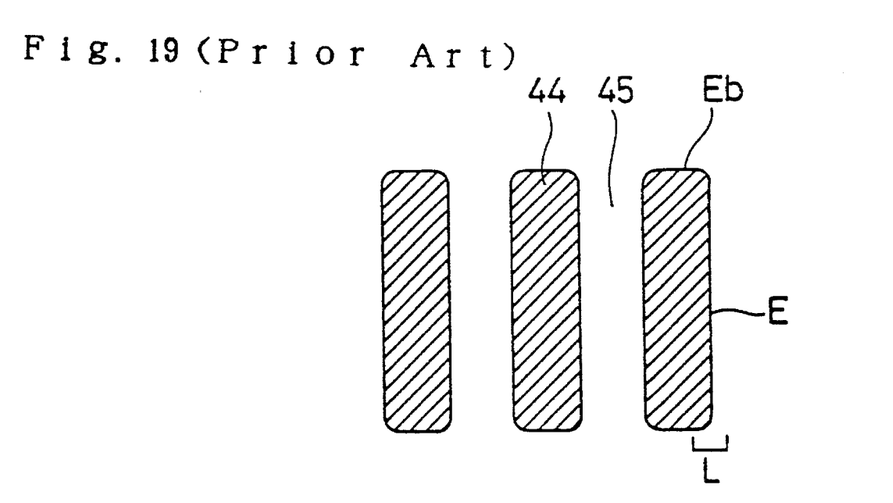
FIG. 19 is a plan view of a phase-shifting pattern formed in the conventional method.
Figure 20:
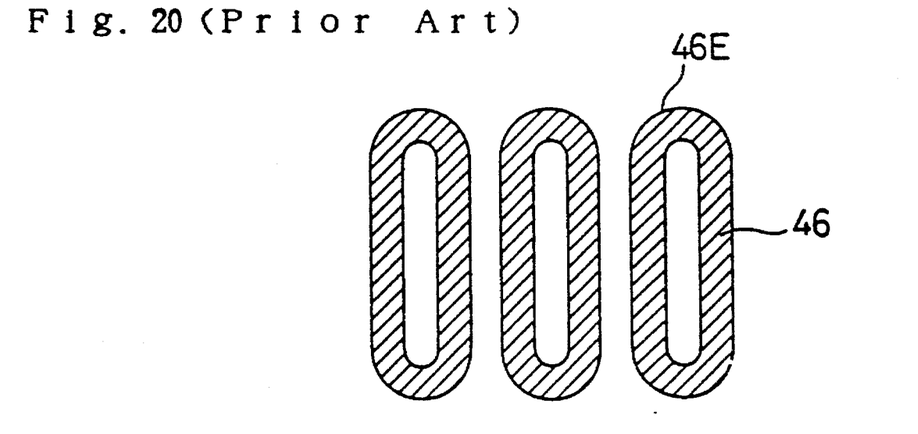
FIG. 20 is a plan view of a fine resist pattern formed in the conventional method.

However, there occurs a problem that a short circuit is generated as shown by 46E in FIG. 20 because a similar effect is generated at an edge portion Eb in the longitudinal direction of the phase-shifting pattern 42a as shown in FIG. 19.

Furthermore, the above method is not appropriate to form a different pattern having a large pattern such as pads or the like and a fine pattern.

SUMMARY OF THE PRESENT INVENTION

The present invention provides a method for forming a fine resist pattern by exposing comprising the steps of:

(i) forming a resist layer on a semiconductor substrate;

(ii) forming a phase shifting pattern in an upper portion of the resist layer, the phase-sifting pattern having a tapered edge corresponding to a portion to which an formation of an objective fine resist pattern is not desired to be formed;

(iii) exposing the entire surface of the semiconductor substrate including the phase-shifting pattern; and (iv) forming a fine resist pattern below an outline except for the tapered edge of the phase-shifting pattern.

An object of the present invention is to provide a method for forming a fine resist pattern on a semiconductor substrate wherein short circuit can be prevented at the edge of a fine resist pattern, and a resist pattern can be formed with different pattern widths only with a small increase in the number of steps.

DETAILED DESCRIPTION OF PREFERRED EMBODIMENT

A semiconductor substrate used in the present invention is not particularly limited to any specific type, but is a silicon substrate, a compound semiconductor substrate or a semiconductor substrate including various device and insulating film.

In step (i), a resist layer is formed on the semiconductor substrate. Materials for this resist layer are examplified with photosensitive resins such as a positive photoresist, a negative photoresist and PMMA (polymethylmethacrylate), to which they are not restricted. The preferred material is novolak resin-O-quinone diazido compound. The resist layer can be formed by the conventional method, for example, to coat a solution of the above photosensitive resin as a base in accordance with the spin-on technique, followed by prebaking the resist layer. The condition of prebaking can be appropriately adjusted depending upon the kind of material used therein. Preferably, the thickness of the resist layer is about 0.63 to 1.20 μm.

In accordance with the step (ii) of the present invention, a phase-shifting pattern is formed in an upper portion of the resist layer. The phase-shifting pattern has a tapered edge corresponding to a portion to which formation of an objective fine resist pattern is not desired.

A method for tapering the edge of the phase-shifting pattern can be realized by exposing in use of a mask and developing. The mask has a portion which has a desired translucency, and the portion corresponds to a position where formation of the objective fine resist pattern is not desired, i.e. where a short circuit may occur. A method for providing the desired translucency is not restricted to any specific one. For example the portion of the mask is formed either a triangular configuration with an acute angle (90° or less) or a round configuration at the edge thereof. It is also possible to implant oxygen ions into a chromium mask pattern using focused ion beam into a portion which is to be provided with the desired translucency to light. A desired translucency ranges preferably between 40 to 60% to exposure light. In such case, it is preferable to adjust the translucent rate so that the rate becomes the largest value at the edge while becoming smaller value toward the inside of the mask. Furthermore, the taper angle assumes 45° or less at the edge of the projecting portion as the phase-shifting pattern.

Conditions of exposure are not particularly limited to any kind, but are adjusted depending on the kind of the material for the resist to be used and the thickness of the resist. The light exposure preferably assumes 60 to 80%, preferably 70% to the threshold .light exposure. KrF Excimer laser (having a wavelength of 248 nm) or i-line (having a wavelength of 365 nm) is preferably used.

After exposure, the resist layer is developed with a suitable developer. The developer is not restricted to any specific type, but it can be appropriately selected depending on the kind of resist material to be used. Preferred developer is $N(CH_3)_4OH$.

The thickness Ts of the phase-shifting pattern can be appropriately adjusted with the above condition of exposure, but is preferable to satisfy the following formula:

$$Ts=(2a-1)\lambda/\{2(n-1)\}$$

(where a represents a natural number, $\lambda$ represents an exposure wavelength (overall exposure wavelength), n represents a rate of diffraction of material constituting a phase-shifting pattern. In addition, the phase shifting may vary within the range of $(1/2)\times\pi$ to $(3/2)\times\pi$.

In accordance with the step (iii) of the present invention, the entire surface of the resist layer including the phase-shifting pattern is exposed. Conditions for exposure is the same as the above.

In the exposure, the phase of light which has passed through the phase-shifting pattern is reversed to the phase of light which has passed through the recessed portions. This results in the mutual offset of the amplitude of exposure light which has passed through the phase-shifting pattern and of exposure light which has passed through the recessed portion at the outline, namely edge of each projecting portion as phase-shifting pattern. Consequently, the light intensity of exposure light becomes zero in the lower region of the outline of the phase-shifting pattern.

On the other hand, the phase of light which has passed through the tapered edge of the phase-shifting pattern is not reversed to the phase of light which has passed through the recessed portions. This dose not completely results in the mutual offset of the amplitude of exposure light which has passed through the tapered edge of the phase-shifting pattern and the recessed portion. Consequently, the light intensity of exposure light dose not become zero in the lower region of the tapered edge of the phase-shifting pattern.

Therefore, in step (iv), a fine resist pattern with the desired configuration can be formed without causing a short circuit only at the lower region of the outline except for the tapered edge of the phase-shifting pattern by exposing the resist pattern including the phase-shifting pattern and then developing. At this time, resist patterns and pads having a different line width can be formed by exposure using a mask with a desired configuration. The fine resist pattern can be having a line width of about 0.15 to 0.25 μm, a pattern width of about 0.35 to 0.50 μm and a thickness of about 0.20 to 1.00 μm.

In addition, when a mask with a desired configuration is used in the exposure of step (iii) to the phase-shifting pattern, fine resist patterns with different line widths can be simultaneously formed.

Examples of the method for forming a resist pattern in accordance with the present invention will be detailed hereinbelow in conjunction with the accompanying drawings.

EXAMPLE 1

Figure 1:
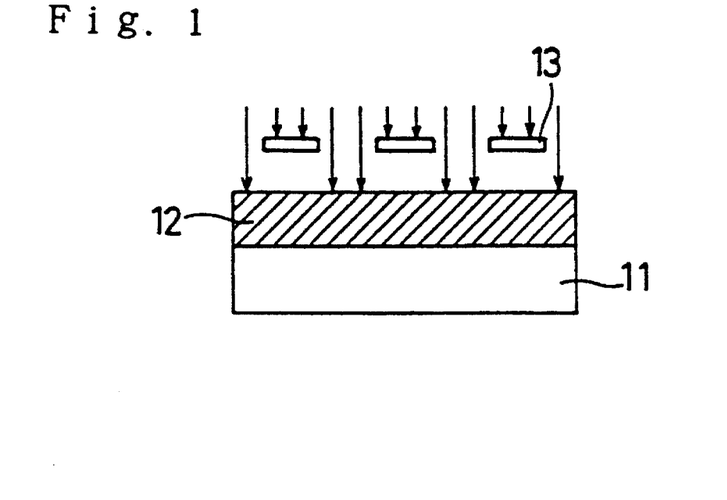
FIG. 1 is a schematic sectional view of an essential portion thereof showing the first step, Embodiment 1 of a method for forming a resist pattern according to the present invention.

As shown in FIG. 1, a Si semiconductor substrate 11 was subjected to a treatment for improving adhesiveness using hexamethyldisilane, namely what is called the HMDS treatment, followed by applying a positive type photoresist solution (using as a base novolak resin-O-quinonediazido compound) with the spin-on method. Then the semiconductor substrate is further subjected to prebaking process for 60 seconds at 90° C. to form thereon a resist layer 12 having a thickness A of 1.2 μm.

Figure 4:
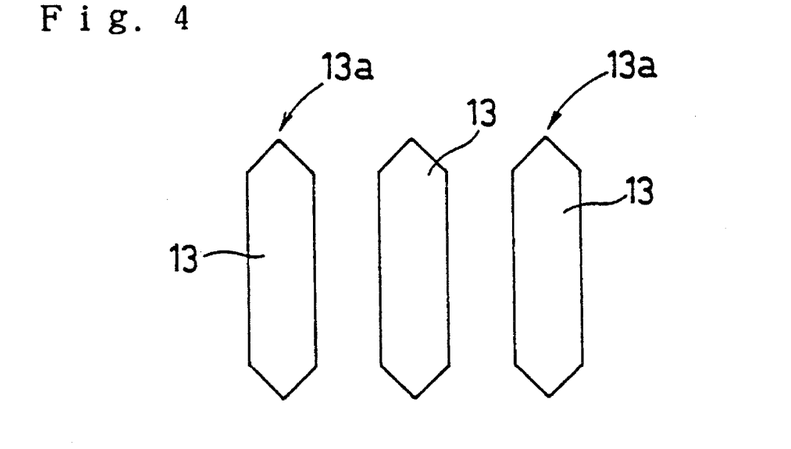
FIG. 4 is a plan view showing a mask used in Embodiment 1 of the present invention.

Subsequently, the semiconductor substrate 11 having the resist layer 12 is exposed by using a mask 13 arranged on a predetermined position of the above resist layer 12 and an i-line (with n wavelength of 365 nm) stepper having an NA of 0.45 with a light exposure of 140 msec (70 mJ/cm$^2$) which is less than the threshold value (Eth=200 msec). FIG. 4 shows a plan view of a mask 13 used in the above process, the edge 13a of the mask 13 in the longitudinal direction assuming an acute triangle configuration with an angle of 90°.

Figure 2:
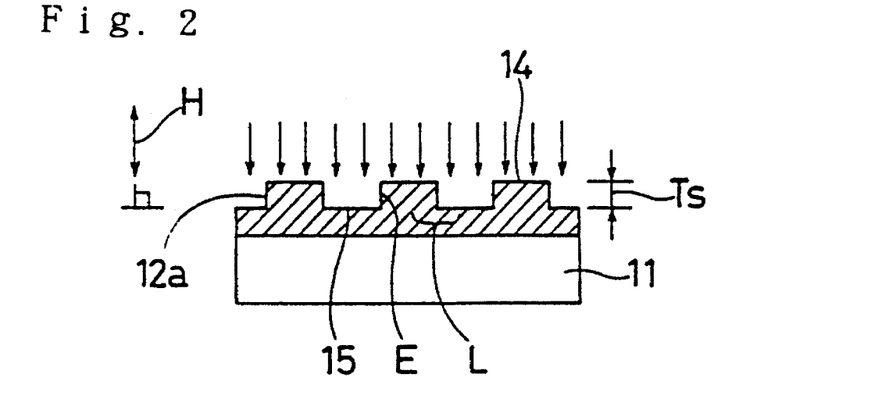
FIG. 2 is a schematic sectional view of an essential portion thereof showing the second step, Embodiment 1 of a method for forming a resist pattern according to the present invention.

Then, as shown in FIG. 2, the semiconductor substrate 11 having a exposed resist layer 12 is subjected to PEB (post-exposure bake), followed by developing the resist layer 12 with 2.38% solution of tetramethylammonium hydroxide (N(CH$_3$)$_4$OH), namely so-called TMAH and partially patterning the surface layer of the resist layer 12 to form a phase-shifting pattern 12a having projecting portions 14. In the process, a thickness Ts of the phase-shifting pattern 12a is identical to the height of the projecting portion 14 in the vertical direction to the substrate 11 (direction of an arrow shown by Symbol H in FIG. 2). The thickness Ts can be determined by the formula:

$$Ts=\lambda/\{2\times(n-1)\}$$

where λ represents exposure wave-length, and n represents diffraction rate of the resist layer.

In this Example, since values such as n=365 nm and n=1.68 are given, Ts is determined to be 0.268 μm.

Figure 5:
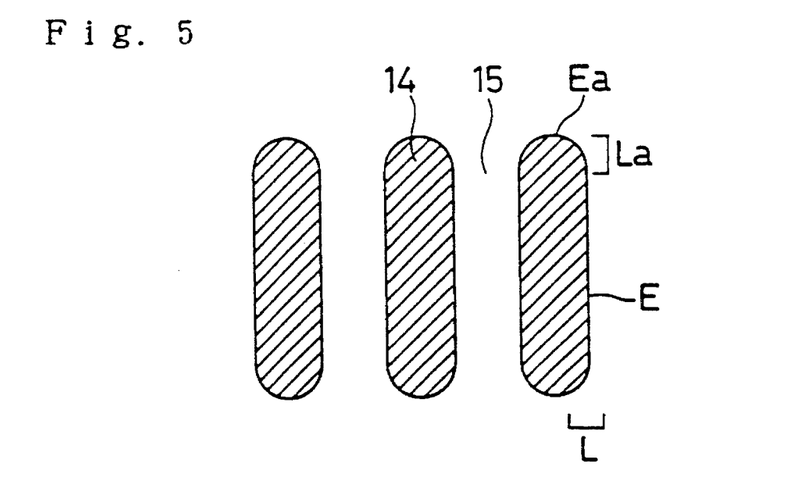
FIG. 5 is a plan view showing a phase-shifting pattern formed in Embodiment 1 of the present invention.

As shown in FIG. 5, the tip of the edge Ea of the projecting portion 14 as the phase-shifting pattern 12a is rounded at this time owing to the detour of light at the edge 13a of the mask pattern shown in FIG. 4 so that the edge Ea becomes a tapered configuration.

Figure 7:
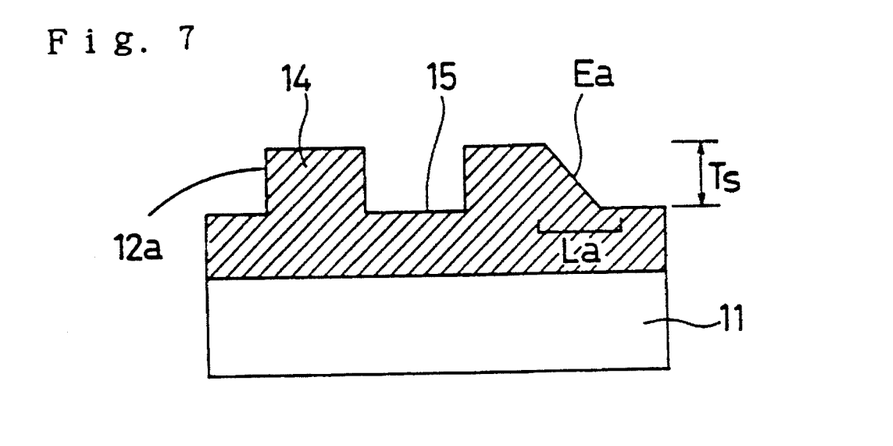
FIG. 7 is a schematic sectional views showing a shape of a projecting portion in the longitudinal direction of the phase-shifting pattern.
Figure 8:
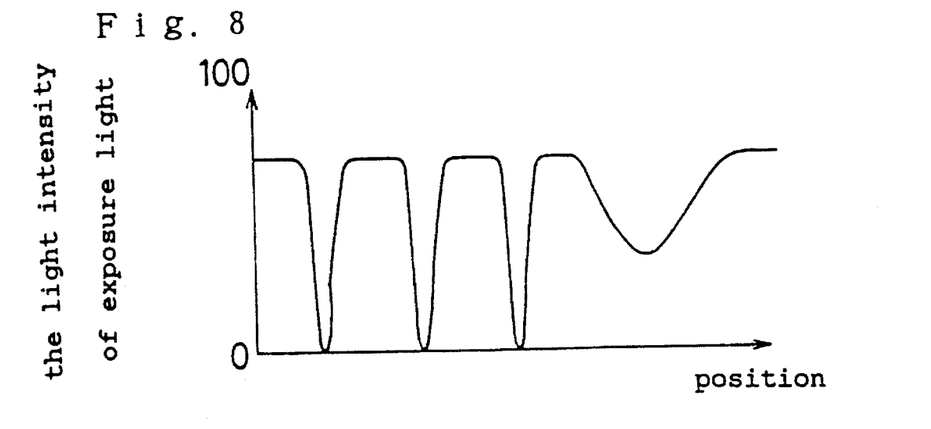
FIG. 8 is a diagram showing a relative intensity corresponding to the shape of projecting portion as shown in FIG. 7.

Subsequently, the entire surface of the Si semiconductor substrate 11 including the phase-shifting pattern 12a is exposed by light exposure of 140 msec (70 mJ/cm2) with an i-line stepper having NA of 0.45. At this time, the phase of exposure light passing through the projecting portion 14 is inverted. As a consequence, the optical amplitude of the exposure light passing through the projecting portion 14 offsets the optical amplitude of the exposure light passing through the recessed portion 15 thus decreasing the light intensity of exposure light at the edge E to 0 (see FIG. 8). Consequently, the resist layer in the lower region L of the edge E where light intensity becomes 0 remains unexposed. The unexposed resist pattern remains as a fine resist layer in the subsequent step. On the other hand, at the tapered edge Ea (FIG. 7) intensity of exposure light in the lower region La of the edge Ea does not become 0 (FIG. 8) so that the resist layer is exposed in this region. The exposed resist layer is removed in the following step.

Figure 3:
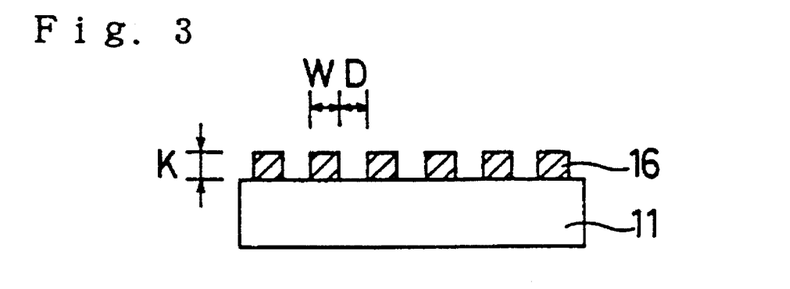
FIG. 3 is a schematic sectional view of an essential portion thereof showing the third step, Embodiment 1 of a method for forming a resist pattern according to the present invention.
Figure 6:
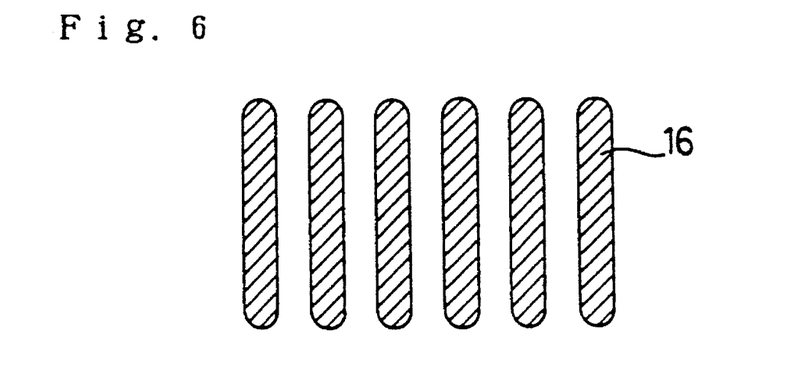
FIG. 6 is a plan view showing a fine resist pattern formed in Embodiment 1 of the present invention.

Then, in the same way with the formation of the above phase-shifting pattern 12a, the Si semiconductor substrate 11 is subjected to development for 60 sec with 2.38% solution of TMAH as a developer and then prebaked thereby forming a fine resist pattern 16 having a line width W of 0.15 μm, a height K of 0.20 μm, a pattern distance D of 0.35 μm without causing short circuit at the pattern edge (FIG. 3, FIG. 6).

Thus, the present example allows forming a fine resist pattern 16 having a finer line width of 0.15 μm whereas the conventional phase-shifting method is only limited to the formation of a line having a width of 0.35 μm. Thus, the present invention can improve the resolution twice or more.

EXAMPLE 2

Example 2 is directed to another method for tapering the pattern edge by using a translucent to exposure light with the pattern edge of a mask for forming a phase-shifting pattern.

Figure 9:
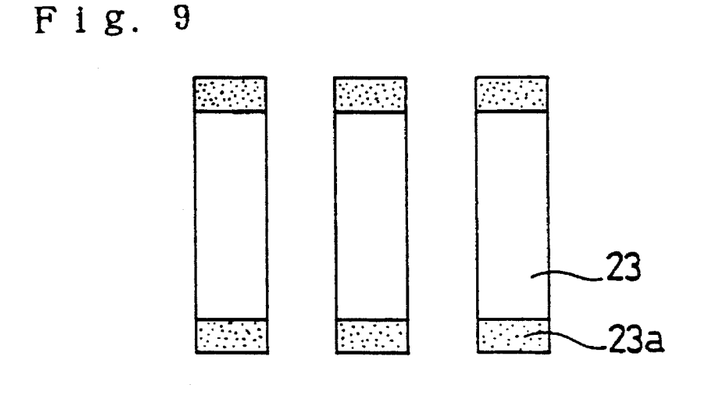
FIG. 9 is plan view of a mask used in Embodiment 2 of the present invention.
Figure 10:
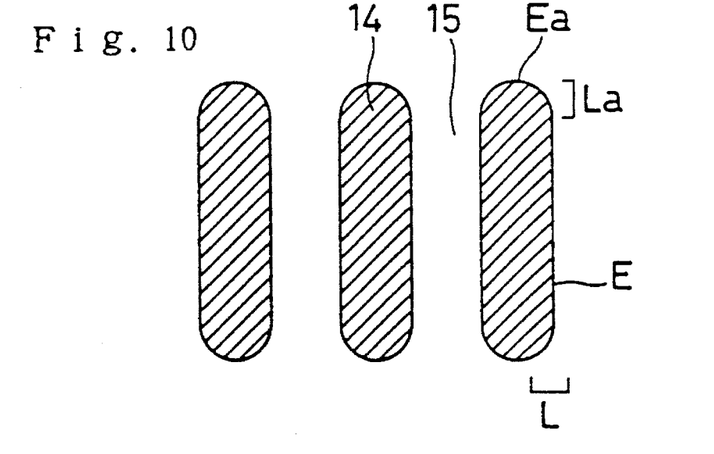
FIG. 10 is a plan view of a phase-shifting pattern formed in Embodiment 2 of the present invention.
Figure 11:
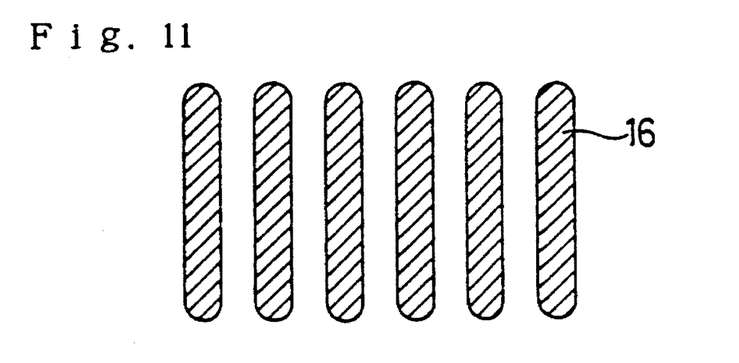
FIG. 11 is a plan view of a fine resist pattern formed in Embodiment 2 of the present invention.

As shown in FIG. 9, an the edge 23a of a chromium pattern 23 of a mask for forming a phase-shifting pattern is translucent to exposure light. The line width of the chromium pattern 23 is set to 0.5 μm. In addition, the transmittance rate is set to about 50%. Oxygen ions are implanted with a focused ion beam of oxygen to the edge of the chromium pattern as a method for providing a translucent to the chromium pattern. The transmittance rate becomes the highest value at the edge of the pattern (approximately 100%) so that the transmittance rate becomes smaller toward the inner direction.

The remaining steps are followed to in Example 1 to form a fine resist pattern.

EXAMPLE 3

Example 3 details a method for forming a large pattern like a pad as well as a fine resist pattern.

Figure 12:
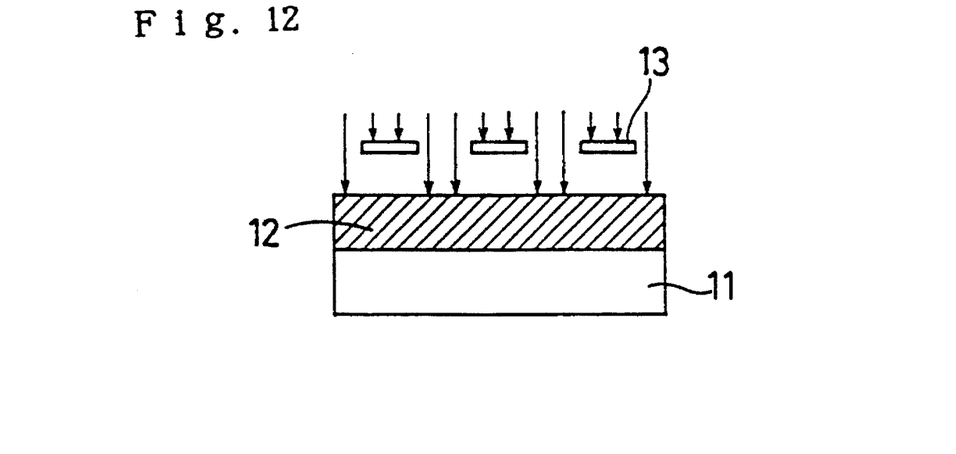
FIG. 12 is a schematic sectional view of an essential portion thereof showing the first step, Embodiment 3 of a method for forming a resist pattern according to the present invention.

As shown in FIG. 12, a resist layer 12 having a thickness of about 1.2 μm is formed in the same manner as Example 1.

Then the Si semiconductor substrate 11 including the resist layer 12 is exposed with a light exposure of 140 msec lower than the threshold value of light exposure (E$_{th}$=200 msec) with the i-line stepper (n=365 nm, NA=0.45) using a mask 13 in the same manner Example 1.

Figure 13:
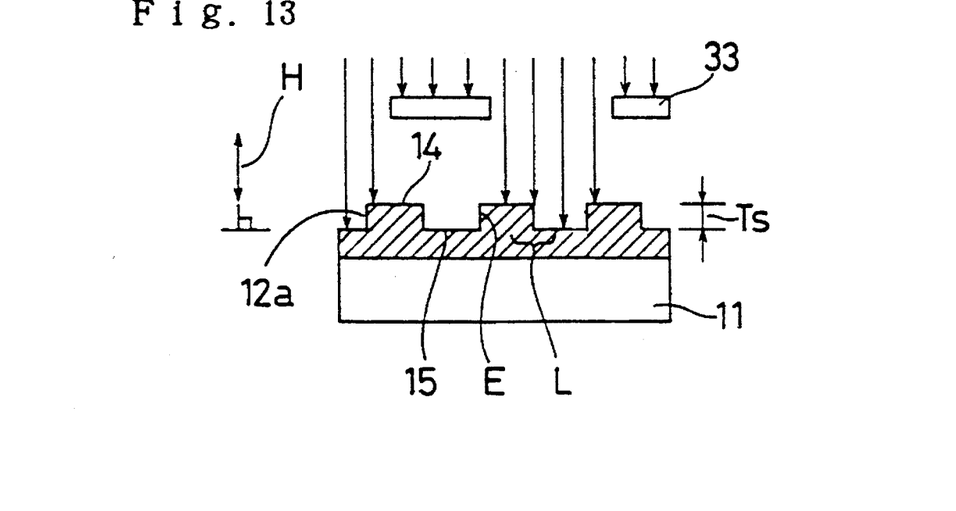
FIG. 13 is a schematic sectional view of an essential portion thereof showing the second step, Embodiment 3 of a method for forming a resist pattern according to the present invention.

As shown in FIG. 13 subsequently formed is a phase-shifting pattern 12a having an uneven configuration by partially patterning the surface layer of the resist layer 12 by developing the semiconductor substrate with a developer same as one used in Example 1 following the PEB process. At this time, a phase-shifting pattern 12a having a height Ts means a height in the vertical direction (direction of an arrow shown by Symbol H in FIG. 13). The height Ts of the projecting portion 14 is 0.268 μm in the same manner as Example 1.

Then, the Si semiconductor substrate 11 including a phase-shifting pattern 12a was exposed by exposure light having a light exposure of 140 msec (70 mJ/cm2) with an i-line stepper (NA=0.45) using a mask 33 and the phase-shifting pattern 12a, the phase of light passing through the projecting portion 14 is inverted. As a consequence the optical amplitude of exposure light passing through the projecting portion 14 offsets the optical amplitude of exposure light passing through the recessed portion 15 to decrease the light intensity of exposure light at the edge E to 0. (see FIG. 8). Consequently, in the lower region L at the edge E of the phase-shifting pattern where light intensity becomes 0, the resist layer remains unexposed. This unexposed resist layer remains as a fine resist pattern in the subsequent step.

In addition, the resist layer in a portion shielded with a mask 33 is not exposed, the resist layer remains as a large resist pattern in the next step.

Figure 14:
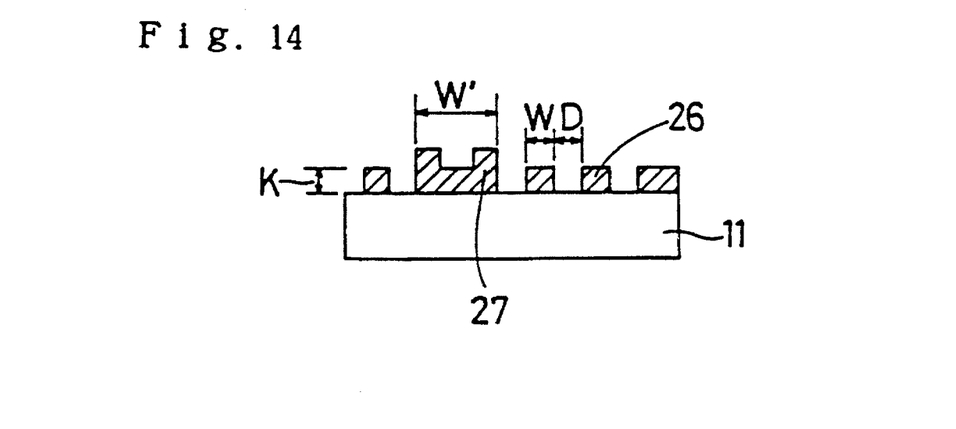
FIG. 14 is a schematic sectional view of an essential portion thereof showing the third step, Embodiment 3 of a method for forming a resist pattern according to the present invention.

Then in the same manner as the formation of the above phase-shifting pattern 12a, 2.38% solution of TMAH is used to develop the resist on the substrate 11 including the phase-shifting for 60 seconds and then pattern 12a is postbaked to form on the Si semiconductor substrate simultaneously a fine resist pattern 26 having a line width W of 0.15 µm, a height K of 0.20 µm and a pattern distance D of 0.35 µm and a large pattern 27 having a width W' of 2.0 µm (FIG. 14).

In this way, while the conventional method which does not use a phase-shifting pattern only allows forming a line having a minimum width of 0.35 µm, Example 3 allows forming a fine resist pattern 26 having a line width of 0.15 µm as well as a pattern 27 with a line width of 2.0 µm which could not be formed with the conventional exposure method thereby attaining the improvement of resolution two times or more and freedom in forming patterns.

In other words, the present invention involves a method for forming a fine resist pattern by exposing comprising the steps of:

(i) forming a resist layer on a semiconductor substrate;

(ii) forming a phase shifting pattern in an upper portion of the resist layer, the phase-sifting pattern having a tapered edge corresponding to a portion to which formation of an objective fine resist pattern is not desired;

(iii) exposing the entire surface of the semiconductor substrate including the phase-shifting pattern; and (iv) forming a fine resist pattern below an outline except for the tapered edge of the phase-shifting pattern, whereby obtaining a fine resist pattern with a desired configuration without causing a short circuit at the edge of the fine resist pattern.

In addition, when the phase-shifting pattern having a tapered edge is exposed, the exposure allows a simultaneous formation of resist patterns having different line widths using a mask with a desired configuration.

Consequently, the use of the conventional mask, photolithographic apparatus and resist materials allows the formation of a fine resist pattern with a phase-shifting effect on a semiconductor substrate or a simultaneous formation of a fine and a large pattern thereby enabling the improvement of the actual resolution thereof without deteriorating the pattern freedom.

What is claimed is:

1. A method for forming a fine resist pattern by exposing comprising the steps of:

(i) forming a resist layer on a semiconductor substrate;

(ii) forming a phase shifting pattern in an upper portion of the resist layer, the phase-sifting pattern having a tapered edge corresponding to a portion to which formation of an objective fine resist pattern is not desired;

(iii) exposing the entire surface of the semiconductor substrate including the phase-shifting pattern; and (iv) forming a fine resist pattern below an outline except for the tapered edge of the phase-shifting pattern.

2. A method for forming the fine resist pattern according to claim 1 wherein the phase-shifting pattern is formed in use of a mask having a pattern, the pattern has a desired translucency in a portion, and the portion corresponds to a position where formation of the objective fine resist pattern is not desired.

3. A method for forming the resist pattern according to claim 1, wherein the phase shifting pattern is formed in use of a mask having a pattern, the pattern being either an acute triangle configuration or a round configuration in a portion, and the portion corresponding to a position where formation of the objective fine resist pattern is not desired.

4. A method for forming the resist pattern according to claim 1, wherein an entire surface of the semiconductor substrate is exposed using a mask bridging over adjacent phase shifting patterns for shielding a light in step (iii), thereby further forming a fine resist pattern having the phase-shifting pattern with a different width in step (iv).

* * * * *